Feb. 13, 1951 M. L. ALEXANDER 2,541,017

AUTOMATIC STATION SELECTOR

Filed April 30, 1947 2 Sheets-Sheet 1

FIG. I

INVENTOR
MAURICE L. ALEXANDER

BY Arthur A. Smith

ATTORNEY

INVENTOR
MAURICE L. ALEXANDER
BY Arthur A. Smith
ATTORNEY

Patented Feb. 13, 1951 2,541,017

UNITED STATES PATENT OFFICE 2,541,017

AUTOMATIC STATION SELECTOR

Maurice L. Alexander, Fort Wayne, Ind., assignor, by mesne assignments, to Farnsworth Research Corporation, a corporation of Indiana Application April 30, 1947, Serial No. 744,959

8 Claims. (Cl. 250—40)

Figure 1:
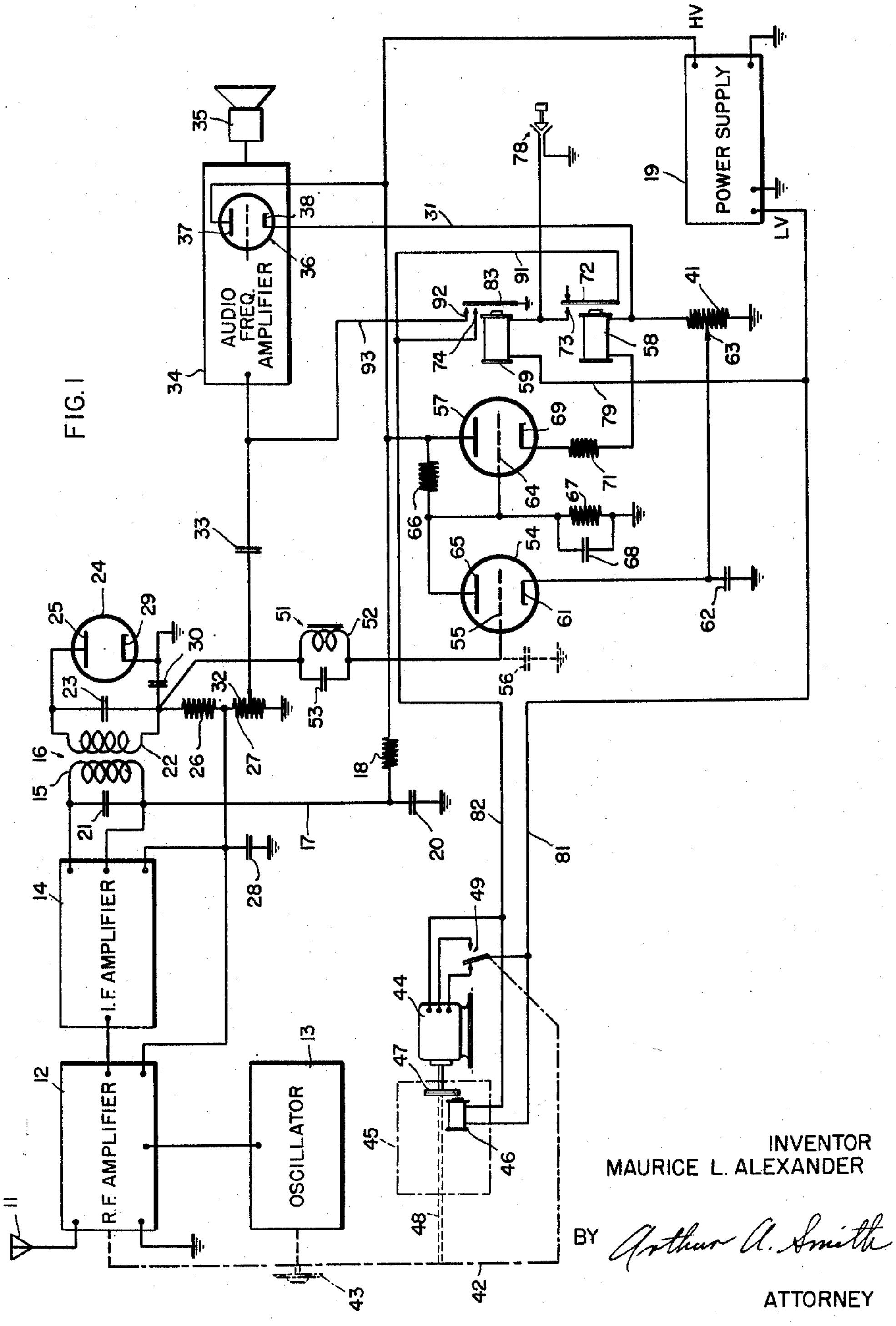

This invention relates to radio receivers and more particularly to automatic station selecting facilities for use in conjunction with radio receivers.

One type of automatic station selecting apparatus which is preferred for use in connection with certain types of radio receivers, such as those designed for installation in motor vehicles and the like where a minimum of attention by the vehicle operator is required for tuning the receiver, is that which employs the so-called "stop-on-carrier" principle of operation. In general, such receivers include a motor-driven tuning mechanism which is provided with a manual means such as a push button switch, for initiating the operation of the tuning apparatus. This apparatus then searches for a carrier wave having suitable strength and a frequency different from the frequency of the carrier wave to which the receiver was previously tuned.

Most automatic station selecting apparatus employing this principle requires some modification of the conventional receiver circuits in order to develop the required voltages for the control of the tuning mechanism. In some cases one or more of the intermediate frequency transformers have to be specially designed. Also, some prior art systems of this character require the addition of another rectifier. Moreover, a great many of the receivers equipped with automatic tuning mechanisms of this character, which previously have been designed, require the diversion of substantial energy for the development of the control voltages.

It, therefore, is an object of the present invention to provide automatic station selecting facilities for a radio receiver which may be incorporated into a conventional receiver without substantial modification thereof and without reducing the efficiency of the receiver.

Another object of the invention is to provide an automatic station selecting facility for use in conjunction with a conventional radio receiver, whereby the control voltages for the tuning mechanism are derived in a novel manner without utilizing any substantial amount of the energy developed in the receiver for the normal reproduction of intelligence signals.

In accordance with the invention, there is provided a conventional radio receiver which includes a source of carrier wave of a predetermined frequency. The receiver also includes a conventional signal detector which is coupled to the source of carrier wave and which is provided with a network, one terminal of which is coupled to a terminal of the carrier wave source in such a manner that there is developed at this terminal of the carrier wave source a unidirectional voltage and an alternating voltage, both of which are representative of the tuning of the receiver to the frequency of a carrier wave. For automatic station selecting purposes, there is provided a motor-driven tuning mechanism. The initiation of the operation of this mechanism is under the control of an operator. The tuning mechanism is provided with control apparatus including a vacuum tube having a control grid which functions to arrest the operation of the tuning mechanism in response to the tuning of the receiver to resonance with a received carrier wave. The vacuum tube is subject to control by a combination of the unidirectional and alternating voltages developed in the receiver. These voltages are impressed upon the control grid of this tube simultaneously by means of a circuit which includes a reactive network coupled between the vacuum tube control grid and the terminal of the carrier wave source at which these voltages are developed.

In accordance with an important feature of the present invention, the circuit by means of which the two control voltages are impressed upon the grid of the vacuum tube, includes a resonant circuit connected between the source of the voltages and the control grid. The vacuum tube is of such a character that there is effective at the control grid thereof an appreciable apparent capacitance representative of the interelectrode capacitance of the tube. The interelectrode capacitance of the tube and the capacitance element of the resonant circuit comprise a voltage divider for the alternating voltage. By reason of the fact that the resonant circuit has a high Q, it has an appreciable voltage magnifying property. Therefore, the development at the carrier wave source terminal of a relatively small value of alternating voltage and the impression of this voltage upon the resonant circuit, results in the development of a voltage of sufficient magnitude to control the operation of the vacuum tube. By suitably proportioning the resonant circuit capacitor in the voltage divider circuit in relation to the interelectrode capacitance of the tube, a suitable proportion of the voltage developed by the resonant circuit may be applied to the grid of the tube to control its operation.

For a better understanding of the invention, together with other and further objects thereof, reference is made to the following description, taken in connection with the accompanying drawings, and its scope will be pointed out in the appended claims.

Figure 2:
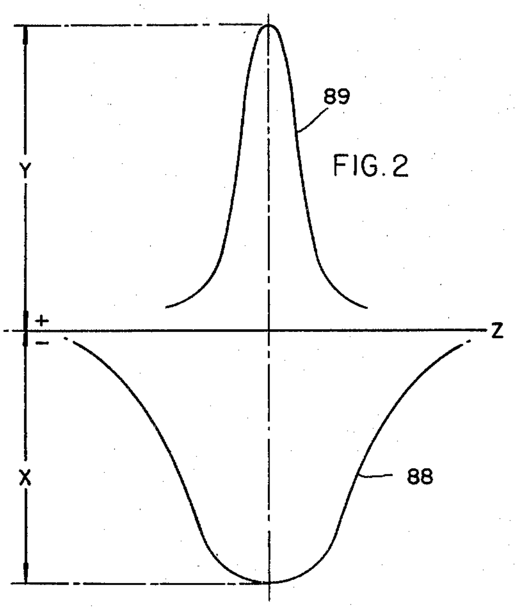
Figure 3:
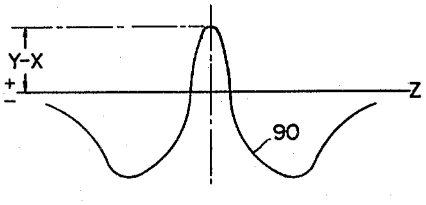
Figure 4:
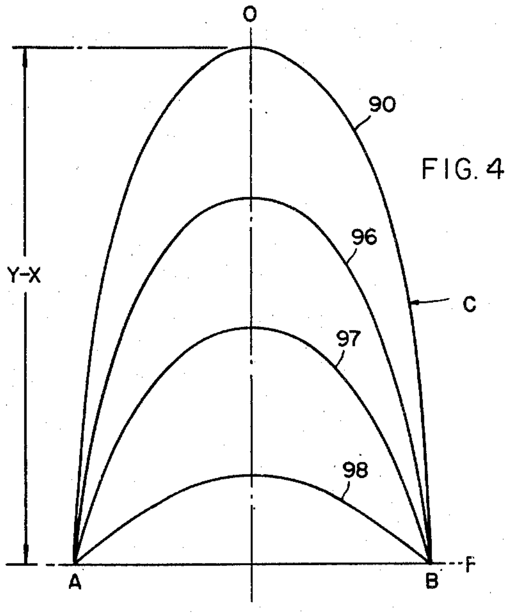

In the accompanying drawings:

Fig. 1 is a partly schematic circuit diagram of a conventional radio receiver equipped with an automatic station selecting facility in accordance with the invention; and Figs. 2, 3 and 4 are curves of certain of the control voltages employed in connection with the station selecting apparatus.

Referring now to Fig. 1 of the drawings, there is shown generally in the upper half thereof, a superheterodyne type of receiver which in most respects is conventional. Carrier signal energy is collected by an antenna 11 and is impressed upon a radio frequency amplifier 12. There is also coupled to this amplifier a local oscillator 13 whereby the amplifier may function also as a frequency converter stage. The output of the radio frequency amplifier 12 is coupled to the input of an intermediate-frequency amplifier 14. Space current for the intermediate-frequency amplifier tubes is provided by a connection, which includes a conductor 17 and a resistor 18, to the high voltage terminal HV of a power supply 19. A capacitor 20 is connected between resistor 18 and ground whereby to by-pass the intermediate radio frequency which may exist at this point.

The output of the intermediate-frequency amplifier 14 is coupled to the primary winding 15 of an intermediate-frequency transformer 16. The primary transformer winding is tuned to the intermediate frequency by a shunt connected condenser 21. The intermediate-frequency transformer 16 also is provided with a secondary winding 22 which is inductively coupled to the primary winding and is shunted by a condenser 23 by means of which the winding is resonated at the intermediate frequency.

There is coupled to the secondary winding 22 a radio signal rectifying or detection circuit. This circuit includes detector diode 24, the anode 25 of which is connected to the upper terminal of the winding 22 and the cathode 29 of which is connected to ground. The other terminal of the secondary transformer winding 22 is connected through a series capacitor 30 to cathode 29. For the purpose of providing an automatic volume control voltage and an audio output signal, there is provided a series arrangement of resistors 26 and 27 which are coupled to the cathode end of winding 22 and are terminated in a connection with ground. A condenser 28 is connected to the junction point of resistors 26 and 27 and is also termiated to ground, thereby serving to filter the intermediate carrier frequency component from the audio signal detection circuit. The filtered voltage at condenser 28 may also be applied to the radio frequency amplifier 12 and to the intermediate-frequency amplifier 14 to effect automatic volume control in the usual manner.

The resistor 27 is provided with a tap 32 which is coupled by a condenser 33 to an audio frequency amplifier 34. The tap 32 affords a means of controlling the magnitude of the audio signal input voltage to the amplifier 34. The output of the audio signal amplifier 34 is coupled to a loud-speaker 35 for the audible reproduction of the amplified signals. An output tube 36, indicated as included in the amplifier 34, is illustrated for the purpose of showing the cathode and anode connections. The anode 37 is connected to the high voltage terminal HV of the power supply 19. The cathode 38 is coupled to the control circuit and to a resistor 41 which is terminated in a connection to ground. As will be hereinafter explained, the cathode current of output tube 36 is employed for biasing purposes in the automatic station selecting apparatus. The output tube 36 is purely illustrative and may represent a conventional push-pull amplifier stage.

The radio frequency amplifier 12 may be tuned, and the frequency of the local oscillator 13 may be varied simultaneously, in a conventional manner, by mechanically coupling the respective tuning elements by a linkage 42. These tuning elements may be controlled manually by means of a tuning dial 43 connected to the linkage. Also, these tuning elements may be controlled automatically by a motor 44, the shaft of which may be connected to the linkage 42 by a magnetically operated clutch 45.

The magnetic clutch 45 comprises a solenoid 46 and a clutch element 47 which is coupled by a shaft 48 to the linkage 42. The solenoid 46 and the motor 44 are connected in parallel with one another, whereby the simultaneous energization thereof will cause the operation of the motor to rotate shaft 48 and effect movement of the linkage 42. The motor 44 is provided with a reversing switch 49 which may be operated manually at any time and the position of which will determine the direction of motor rotation. The reversing switch 49 is also coupled to the linkage 42 for automatically reversing the motor 44 at either end of the tuning range covered by the amplifier 12 and the oscillator 13.

In order to effect the automatic tuning of the radio receiver by means of the motor 44 and its associated apparatus, the receiver is provided with additional control facilities. A high "Q" shunt tuned circuit 51 is responsive to the intermediate frequency and comprises coil 52 and capacitor 53 and has one terminal thereof connected to the cathode side of secondary winding 22, the other terminal being connected to a signal responsive tube 54 which preferably is a Hi-Mu triode. In this manner the normal operation of the intermediate-frequency transformer 16 is disturbed as little as possible, while at the same time two distinct voltages may be extracted from the secondary winding 22 circuit and applied through the high "Q" circuit 51 to the grid 55 of tube 54. These voltages comprise a radio frequency voltage, which is built up across the resonant high "Q" circuit 51, and the normal rectified unidirectional voltage supplied by diode detector 24.

The control apparatus comprises the signal responsive vacuum tube 54, a relay control tube 57 and two relays 58 and 59. The cathode 61 of tube 54 is connected by a condenser 62 to ground whereby the cathode is maintained effectively at ground potential for alternating currents of intermediate frequency. The cathode 61 also is connected to a tap 63 on the resistor 41, whereby there may be applied to the input circuit of the tube 54 a fixed unidirectional biasing voltage of predetermined magnitude for a purpose to be described. Space current for the tube 54 is provided by a circuit extending from the high voltage terminal HV of the power supply 19, through a control resistor 66 to the anode 65 of the tube. The grid 55 of the signal responsive tube 54 is coupled to the output of the high "Q" circuit 51. The tube 54 is normally biased to cutoff and, in conjunction with the resistor 66, controls the biasing and operation of tube 57.

The grid 64 of the relay control tube 57 is directly coupled to the anode 65 of the tube 54 and is also connected through a biasing resistor 67 to ground. The biasing resistor 67 is shunted by a condenser 68 in order to by-pass currents of intermediate frequency appearing in the anode circuit of the tube 54 so that the operation of the tube 57 is in no way affected by the intermediate-frequency signal. Anode current for the tubes 54 and 57 is provided by a connection to the high voltage terminal HV of the power supply 19. The cathode 69 of the tube 57 is connected to a resistor 71 which is coupled in series with the winding of the relay 58 to ground by way of the resistor 41. The inclusion of the relay winding 58 in the circuit of the tube 57 effects the traversal of this winding by output circuit currents whereby its operation may be controlled. It is to be noted that the circuit connected to the cathode 38 of output tube 36 is connected by conductor 31 to the junction point of the relay winding 58 and the resistor 41. The cathode current of output tube 36 flowing through resistor 41 may therefore be employed to render a relatively stabilized voltage to the cathode 69 of tube 57.

The relay 58 is provided with an armature 72 which, when the relay is energized, is adapted to engage a contact 73. The contact 73 is connected to the solenoid of motor control relay 59, whereas the armature 72 is connected to a contact member 74 of the relay 59. As will be hereinafter explained, the signal responsive relay 58 will respond to cathode current variations of tube 57 whereby control may be exercised over the functioning of the motor control relay 59.

In order to initiate operation of the automatic tuning mechanism there is provided a starting switch 78 which is connected in the ground return circuit of the solenoid of relay 59. Operating current for the relay 59 is supplied by a connection through a conductor 79 to the low voltage terminal LV of the power supply 19. The energization of the relay 59, caused by the closure of the starting switch 78, provides for the supply of power to the motor 44 and the clutch 45. A conductor 81 serves to connect the motor 44 and clutch 45 with the low voltage terminal LV of power supply 19, whereas a conductor 82 is connected to contact 74 of the relay 59. An armature 83 is connected to the ground return circuit of power supply 19 and is adapted to engage the contact 74, thereby to complete a circuit for the motor and clutch apparatus.

Before describing in detail the operation of the automatic station selecting mechanism, consideration first will be given to the manner in which the control tube 54 is operated. The input circuit of this tube is subject to the control of three voltages derived from different parts of the receiver. A unidirectional voltage which will be referred to as V—1 is developed across condenser 30 of the diode detector circuit and is derived by connection to the junction point of secondary winding 22 and resistor 26. The voltage V—1 is applied to the control grid 55 of the tube 54 in negative polarity relative to ground and thereby serves as one biasing voltage for the input circuit of this tube. The magnitude of this voltage varies in accordance with the strength of the received carrier wave energy. In other words, when no carrier wave is being received, the voltage V—1 has a minimum value and when the receiver is tuned to a carrier wave of predetermined strength, this voltage has an appreciable magnitude. Inasmuch as the voltage V—1 is derived by rectifying the intermediate-frequency carrier wave developed in the secondary winding 22 of the intermediate-frequency transformer 16, it has a relatively broad frequency response characteristic.

Reference may now be had to Fig. 2 of the drawings wherein the curve 88 substantially illustrates the intermediate-frequency characteristic curve of voltage V—1 as the receiver is tuned through a signal. The voltage magnitude is represented along the abscissa Z whereas the ordinate X refers to the intermediate-frequency band width.

Another control voltage V—2 is derived from the diode detector circuit by means of the high "Q" circuit 51 and comprises a portion of the radio frequency voltage of the signal present in the secondary circuit of transformer 16. This is an alternating voltage having a value which, similarly to the voltage V—1, varies in magnitude in accordance with the strength of the received carrier wave energy. The voltage V—2 is supplied to the control grid 55 of the tube 54 in positive polarity relative to ground and in series with the voltage V—1. Inasmuch as this voltage V—2 is derived from a sharply tuned circuit 51 having a high amplification factor and a low order of damping, it has a relatively narrow frequency response characteristic. The response curve of voltage V—2 is illustrated by the curve 89 in Fig. 2 of the drawings, where the voltage is plotted against the ordinate Y while the abscissa Z refers to frequency.

Finally, there is impressed upon the cathode 61 of the tube 54 a unidirectional biasing voltage V—3 which is derived by the connection of the cathode 61 to the resistor 41. Inasmuch as the current which flows through resistor 41 is derived from the cathode 38 of the audio output tube 36, the voltage developed in this resistor is of positive polarity relative to ground.

Thus, it is seen that the input circuit of the tube 54 is subject to the two unidirectional biasing voltages V—1 and V—3, both of which are impressed upon the input circuit in a manner tending to bias the tube so as to cut off the flow of space current therein. The magnitude of the voltage V—3 is substantially constant since it is derived from the cathode circuit of the audio output tube 36. There is at all times an appreciable flow of current in the resistor 41 and the magnitude of this current does not change appreciably with the signals which are amplified by the audio output tube. Therefore, the setting of the tap 63 on the resistor 41 determines the operating point of the tube 54 and, consequently, controls the sensitivity of the automatic station selection mechanism. The unidirectional voltage V—1 which varies in magnitude depending upon whether the receiver is tuned to the carrier frequency of a transmitting station or not, also is impressed upon the input circuit of the tube 54 in a manner tending to cut off the flow of space current therein. Therefore, whenever the voltage V—2 reaches a magnitude sufficient to overcome the combined biasing effects of the voltages V—1 and V—3, the tube 54 is rendered conducting. The parameters of the various circuits are chosen so that, when the receiver is tuned closely to the carrier frequency of a transmitting station, the magnitude of the voltage V—2 is sufficient to overcome the combined biasing effects of the voltages V—1 and V—3. At all other times, the voltage V—2 is insufficient to render the tube 54 conducting. This principle of operation is illustrated in Fig. 3 of the drawings wherein the curve 90 represents the resultant voltage obtained by combining the voltages V—1 and V—2 which are represented by the curves 88 and 89 respectively of Fig. 2. With respect to curve 90, that portion of the curve extending below the Z axis will be of negative potential and will normally exert a biasing effect, whereas the upper portion of the curve, being the voltage sum of Y and X will be of positive potential and will therefore render the tube 54 conductive.

Referring now to the operation of the automatic tuning mechanism for the radio receiver, assume that the receiver is tuned to a transmitting station. In such a condition the driving motor 44, the clutch 45 and the relays 58 and 59 are de-energized. Inasmuch as the receiver is tuned to a carrier wave of sufficient strength to control the automatic tuning mechanism, the voltage V—2 derived from the high "Q" circuit 51 is of sufficient magnitude to overcome the combined biasing effects of the voltages V—1 and V—3. The tube 54 is conditioned for conduction. The space current which flows through this tube also traverses the control resistor 66 as described. While the tube 54 is drawing space current through this resistor, the input circuit of the tube 69 is biased beyond cutoff and, therefore, is nonconducting. Thus, relays 58 and 59 are in their de-energized states as illustrated.

If now it is desired to tune the receiver to another carrier wave frequency, the push button 78 is depressed whereby a circuit is closed from the low voltage terminal LV of the power supply 19 through conductor 79 to the motor control relay 59 and thence to ground. The energization of the relay 59 causes the grounded armature 83 to engage the contact 74. The motor and clutch energizing circuit is completed through the conductors 81 and 82 to the low voltage terminal LV of power supply 19. The driving motor 44 is started and the clutch elements 47 are engaged thereby effecting a movement of the tuning apparatus of the radio frequency amplifier 12 and the oscillator 13 in a direction dependent upon the position of the motor reversing switch 49.

As soon as the tuning apparatus of the receiver has been moved sufficiently to tune the receiver away from the original carrier wave, the carrier wave energy in the output circuit of the intermediate-frequency amplifier 14 falls to substantially zero, a condition which will be referred to herein as a "no signal" condition. Therefore, voltages V—1 and V—2 are reduced in magnitude to a relatively low level. The input circuit of the tube 54 in this case is controlled substantially by the voltage V—3, and therefore space current in this tube is cut off. The voltage at the anode 65 of the tube 54 is increased positively by reason of the interruption of the current flow through resistor 66 and the impression of this positive voltage upon the control grid 64 of the tube 57 renders this tube conducting. The space current which flows through this tube is of sufficient magnitude to effect the operation of relay 58 and to thereby cause engagement between its armature 72 and the contact 73.

The closure of relay contact members 72 and 73 provides a hold-in switching action whereby the motor control relay will remain energized when pressure is released from the starting switch 78. The ground return circuit for maintaining the energization of relay 59 now includes the armature 72, a conductor 91 and the closed switching members 74 and 83 of relay 59. The motor control relay 59 is now effectively maintained in an operative condition due to the signal relay 58 being energized and it will be apparent that, as will be later described, the de-energization of the signal relay 58 will result in the opening of the relay 59 and its associated circuit to thereby render the motor 44 and the clutch 45 inoperative. During the period of time that the motor control relay 59 is energized the grounded armature 83 also engages a contact member 92 which is coupled by a conductor 93 to the audio input stage of amplifier 34, thereby muting the audio reproducing apparatus including the loudspeaker 35 during the automatic tuning operation.

The tuning of the receiver continues to be changed until a carrier wave of predetermined strength is approached. By reason of the relatively broad frequency response of the voltage V—1, as described, a negative unidirectional voltage of increasing magnitude is impressed upon the control grid of the tube 54. As the receiver is more nearly tuned to the center frequency of the carrier wave, the voltage V—2 derived from the high "Q" circuit 51 increases relatively sharply in magnitude until it is capable of overcoming the combined biasing effects of the voltages V—1 and V—3 in the manner described.

The tube 54, preferably a Hi-Mu triode, normally has an apparent capacity between its grid and cathode elements which is herein illustrated, in dotted form, as condenser 56. In addition to this grid-to-cathode capacity there appears another apparent capacity, not shown, as represented by the grid-to-plate capacitance multiplied by the amplification factor of the tube. Therefore, the total value of capacitance apparent at the grid 55 of tube 54 becomes of reasonable magnitude with respect to the external capacity supplied to the grid circuit by the series arrangement of condensers 53 and 30. Therefore, a portion of the radio frequency component which normally appears across condenser 30 will be divided in inverse proportions across condensers 53 and 56. Thus the radio frequency voltage V—2 is applied to the grid 55 and the conduction of space current in tube 54 again is initiated.

The flow of this current through the resistor 66 develops a negative voltage at the anode of the tube 54 which, when impressed upon the control grid 64 of the tube 57, interrupts the conduction of space current in this latter tube. Relay 58 is de-energized, thus disconnecting the power supply 19 from the winding of relay 59 by the disengagement of armature 72 from contact 73. At the same time, the de-energization of the relay 59 effects the disengagement of its armature 83 from contact 74 thereby deenergizing the motor 44 and the clutch magnet 46, thus arresting further movement of the tuning apparatus of the radio frequency amplifier 12 and the oscillator 13. Simultaneously, the disengagement of the armature 83 from contact 92 disconnects ground from the conductor 93 and the audio input circuit amplifier 34, thereby permitting the amplifier to again function to effect the reproduction of the audio signals in the loud-speaker 35.

Radio receivers equipped with automatic tuning facilities in accordance with the present invention are particularly well suited for mobile installations such as in automotive vehicles for example. However, when they are installed in vehicles such as automobiles, the primary power supply is the storage battery of the vehicle. The voltage of this battery is subject to a considerable range of variation as is well known. Consequently, in order to insure successful operation of the motor control apparatus, it is necessary to provide facilities whereby to compensate for variations in the supply voltage. The present apparatus accordingly is provided with such facilities in the form of the circuit designed particularly for the tube 57 and its associated relay 58.

The manner in which the voltage regulation feature, in acordance with this invention, functions, may be understood best by assuming that the voltage of the power supply 19 increases. As a result, the voltage at the anode of the tube 57 also increases. Except for the compensatory circuit arrangements, the plate current in this tube and also in the tube 54 would increase. However, at the same time, the plate voltage of the audio output tube 36 increases to effect an increased flow of space current through the cathode-connected resistor 41. By connecting the cathode circuit of the tube 57 to the resistor 41, there also is effected a positive increase relative to ground of the cathode biasing voltage of this tube whereby to produce a tendency for the anode-to-cathode voltage of the tube to remain constant. However, at the same time, the anode voltage of the tube 54 increases positively relative to ground thereby, in itself, increasing the biasing voltage impressed upon the control grid 64 of the tube 57. The increased anode voltage of the tube 54 effects an increase in the flow of current through this tube and through the control resistor 66 which tends to oppose in some measure the voltage rise at the control grid 64 of the tube 57. Thus, it is seen that all of the electrodes of the tube 57 have voltages impressed respectively thereon which are increased positively relative to ground. The percentage of these voltage increases, however, are not the same, with the result that so far as the factors considered up to this point are concerned, the control grid-to-cathode voltage supply of the tube 57 is increased positively, thereby creating a condition which would permit more current to flow through the relay 58.

This condition is offset somewhat by reason of the fact that the increased voltage of the power supply 19 also increases the voltages throughout the entire receiver. Consequently, there are produced control voltages such as V—1 and V—2 which also are increased in magnitude. As these voltages are impressed upon the control grid 55 of the tube 54, there is effected an additional flow of current in this tube. This increased current flow which also occurs through the control resistor 66 depresses the voltage applied to the control grid 64 of the tube 57 to a degree sufficient to maintain substantially the original control grid-to-cathode voltage within this tube. As a consequence, there is no appreciable change effected in the magnitude of the space current in the tube 57 and in the winding of the relay 58. Hence, the control apparatus functions to trip the motor-driven tuning mechanism at substantially the same point in a tuning cycle as in the case where the apparatus is energized by a lower supply voltage.

It is considered to be obvious, without further explanation, that if the supply voltage decreases from a normal value, the control apparatus will be conditioned to maintain substantially the same values of current in the winding of relay 58. In such a case, the operation of the automatic tuning mechanism will perform in the same satisfactory manner as in the previously described instances.

It will be evident from the foregoing description that, when the receiver is at resonance with the carrier signal, the tube 54 is conductive and the tube 57 is non-conductive. Thus, the signal relay 58 which is coupled to tube 57 remains deenergized during the time that the receiver is resonant with a carrier signal. When an "off resonance" condition exists in the receiver the tube 57 becomes conductive, thereby energizing the relay 58 which then effects the operation of the motor-driven tuning mechanism. The tuning mechanism will be stopped at the precise moment that tube 54 is again rendered conductive.

The tripping signal voltage employed to render the tube 54 conductive at the signal resonant point must necessarily possess a constant factor which is wholly independent of signal intensity. In other words, the automatic station selection mechanism is required to stop at the exact point of resonance with any one of a plurality of signals, some of which may vary widely in amplitude. In the system of the present invention this triggering action is accomplished with substantial accuracy and reference is now made to Figs. 3 and 4 of the drawings for the explanation of the method herein employed.

Fig. 3 illustrates the voltage resultant after combining the two signal voltages V—1 and V—2 which are represented, respectively, by the previously described curves 88 and 89 of Fig. 2. That portion of curve 90 (Fig. 3) shown above the Z axis, and which is representative of a positive potential resulting from the summation of the voltage factors Y—X, is also illustrated in greater detail in Fig. 4. In this Fig. 4 there is also shown, for comparative purposes, the curves 96, 97 and 98 which may represent signal voltages of positive polarity, which, due to the different intensities of the received signals, possess varying degrees of amplitude. In this instance the curve 90 is indicative of a signal voltage having relatively great amplitude whereas curve 98 represents a signal voltage caused by a carrier signal having a low intensity. These curves are plotted against the voltage ordinate Y—X and an abscissa F which is representative of the intermediate-frequency band width wherein the reference point O is indicative of the exact point of resonance.

It is noted that the curves 90, 96, 97 and 98 each intersect and cross the frequency axis F at points A and B each of which are equidistant from the resonant point O. Thus it will be apparent that the tripping signal voltages illustrated in Fig. 4 have a constant band width, while at the same time the relative peak amplitudes of these voltages are of widely different magnitude. This constancy of band width is obtained, as is well known, whenever tuning circuits are resonated to an identical frequency and coupled to an input signal source. The relative amplitudes of their response curves will remain at a fixed ratio at any given "off frequency" value regardless of the amplitude of the applied signal. Therefore, if the circuits are arranged so that at any given pair of equidistant frequencies on either side of the resonant frequency the amplitudes of the response curves are equal, then these pairs of frequencies will always remain constant for input signals of any amplitude.

It will be understood that the automatic tuning mechanism disclosed in the present invention may then be accurately triggered by a tripping voltage which at all times embodies a substantially fixed band width such as that included between the points A and B (Fig. 4).

The tripping point, or sensitivity level at which the control circuits may be energized may be regulated, as explained, to points of greater or lesser sensitivity. For instance, assume that the sensitivity control is adjusted to render the bias voltage V—3 for the control tube so as to effect cutoff at the point indicated by the arrow C. The automatic station selector may then be tripped into operation only by the voltages represented by the curves 90 and 96 due to their being of greater amplitude than the cutoff level established at point C. The voltages represented by curves 97 and 98, having insufficient magnitude to overcome this biasing level, will not operate as tripping voltages. It will be apparent from the description of the system of the present invention that the biasing level may be varied in either direction along the Y—X axis and to thereby serve as a sensitivity control whereby the automatic tuning of the receiver apparatus may be effected, at the discretion of the operator, by signals having intensities of either large or small magnitude.

While there has been described what is at present considered the preferred embodiment of the invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. In a radio receiver, a motor-driven tuning mechanism, a control circuit for initiating and arresting operation of said tuning mechanism, an intermediate-frequency transformer having a primary winding and a secondary winding, means for impressing upon said primary winding a carrier wave having an intermediate frequency, a rectifier coupled to a first terminal of said secondary winding, a capacitor connected to a second terminal of said secondary winding to develop at said second terminal an alternating voltage representative of the tuning of said receiver to a carrier wave and having a relatively narrow frequency response characteristic, a resistor connected to said second secondary winding terminal to develop at said second terminal a unidirectional voltage representative of the tuning of said receiver to a carrier wave and having a relatively broad frequency response characteristic, a normally non-conductive vacuum tube having a control grid, means for coupling said tube to said control circuit, and means including a high Q resonant circuit connected between said second secondary winding terminal and said control grid for developing a resultant of said voltage and rendering said tube conductive in response to the combination of said alternating and unidirectional voltages, whereby to arrest the operation of said tuning mechanism concomitantly with the tuning of said receiver to resonance with a received carrier wave.

2. In a radio receiver, a motor-driven tuning mechanism, a control circuit for initiating and arresting operation of said tuning mechanism, an intermediate-frequency transformer having a primary winding and a secondary winding, means for impressing upon said primary winding a carrier wave having an intermediate frequency and modulated by an audio signal, a rectifier coupled between a first terminal of said secondary winding and ground, a capacitor connected between a second terminal of said secondary winding and said rectifier to develop at said second terminal an alternating voltage of positive polarity relative to ground, a resistor connected between said second secondary winding terminal and said rectifier to develop at said second terminal a unidirectional voltage of negative polarity relative to ground, a normally non-conductive vacuum tube having a control grid, means for coupling said tube to said control circuit, and a high Q resonant circuit connected between said second secondary winding terminal and said control grid for developing a resultant of said voltages and rendering said tube conductive in response to the combination of said alternating and unidirectional voltages, whereby to arrest the operation of said tuning mechanism concomitantly with the tuning of said receiver to resonance with a received carrier wave.

3. In a radio receiver, a motor-driven tuning mechanism, a control circuit for initiating and arresting operation of said tuning mechanism, an intermediate-frequency transformer having a primary winding and a secondary winding, means for impressing upon said primary winding a carrier wave having an intermediate frequency and modulated by an audio signal, a rectifier coupled between a first terminal of said secondary winding and ground, a capacitor connected between a second terminal of said secondary winding and ground to develop at said second terminal an alternating voltage of positive polarity relative to ground and having a relatively narrow frequency response characteristic, a resistor connected between said second secondary winding terminal and ground to develop at said second terminal a unidirectional voltage of negative polarity relative to ground and having a relatively broad frequency response characteristic, a normally non-conductive vacuum tube having a control grid, means for coupling said tube to said control circuit, and a high Q parallel resonant circuit connected between said second secondary winding terminal and said control grid for developing a resultant of said voltages and rendering said tube conductive in response to the combination of said alternating and unidirectional voltages, whereby to arrest the operation of said tuning mechanism concomitantly with the tuning of said receiver to resonance with a received carrier wave.

4. In a radio receiver, a motor-driven tuning mechanism, a control circuit for initiating and arresting operation of said tuning mechanism, an intermediate-frequency transformer having a primary winding and a secondary winding, means for impressing upon said primary winding a carrier wave having an intermediate frequency and modulated by an audio signal, a diode rectifier coupled to said secondary winding, a high Q resonant circuit conductively coupled to said secondary winding, a vacuum tube coupled to said control circuit and having a control grid for controlling said tuning mechanism, and a conductive coupling between said control grid and said resonant circuit for conditioning said tube to arrest the operation of said tuning mechanism in response to the tuning of said receiver to resonance with a received carrier wave.

5. In a radio receiver, a motor-driven tuning mechanism, a control circuit for initiating and arresting operation of said tuning mechanism, a source of intermediate-frequency carrier wave modulated by an audio signal, a rectifier conductively coupled to said source for developing a unidirectional voltage representative of the receiver response to a received carrier wave, means including a high Q resonant circuit conductively coupled to said source for developing an alternating voltage representative of the response of said receiver to a received carrier wave, control apparatus for said tuning mechanism including a vacuum tube coupled to said control circuit and having a control grid, and means for impressing upon said control grid said unidirectional voltage and said alternating voltage, whereby to arrest the operation of said tuning mechanism in response to the tuning of said receiver to resonance with a received carrier wave.

6. In a radio receiver, a motor-driven tuning mechanism, control apparatus coupled to said tuning mechanism including a vacuum tube having a control grid, means coupled to said control apparatus to initiate operation of said tuning mechanism, a secondary winding of an intermediate frequency transformer constituting a source of alternating voltage representative of the tuning of said receiver to a carrier wave, and a high Q resonant circuit conductively coupled between said voltage source and said control grid to condition said control apparatus to arrest operation of said tuning mechanism in response to the tuning of said receiver to resonance with a received carrier wave.

7. In a radio receiver, a motor-driven tuning mechanism, control apparatus coupled to said mechanism including a vacuum tube having a control grid and appreciable interelectrode capacitance effective at said control grid, means coupled to said control apparatus to initiate operation of said tuning mechanism, a source of alternating voltage representative of the tuning of said receiver to a carrier wave, a high Q resonant circuit comprising a coil and a capacitor connected in shunt therewith, and means conductively coupling said resonant circuit in series with said interelectrode capacitance to said voltage source for arresting operation of said tuning mechanism in response to the tuning of said receiver to resonance with a received carrier wave.

8. In a radio receiver, a motor-driven tuning mechanism, control apparatus coupled to said tuning mechanism, including a vacuum tube having a control grid and appreciable interelectrode capacitance effective at said control grid, means coupled to said control apparatus to initiate operation of said tuning mechanism, a source of alternating voltage representative of the tuning of said receiver to a carrier wave, means including a high Q resonant circuit conductively coupled to said voltage source for developing a magnified alternating voltage, said resonant circuit including a capacitor, and means coupling said resonant circuit to said control grid in a manner that said capacitor and said interelectrode capacitance effect a suitable division of said magnified voltage for impression on said control grid to condition said control apparatus to arrest operation of said tuning mechanism in response to the tuning of said receiver to resonance with a received carrier wave.

MAURICE L. ALEXANDER.

REFERENCES CITED

The following references are of record in the file of this patent:

UNITED STATES PATENTS

| Number | Name | Date |
|---|---|---|
| 2,044,645 | Stapleton et al. | June 16, 1935 |
| 2,108,154 | Van Loon | Feb. 15, 1938 |
| 2,262,218 | Andrews | Nov. 11, 1941 |